(12) United States Patent
Lee

(10) Patent No.: US 7,643,338 B2
(45) Date of Patent: Jan. 5, 2010

(54) METHOD FOR PROGRAMMING A FLASH MEMORY DEVICE

(75) Inventor: Hee Youl Lee, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 91 days.

(21) Appl. No.: 11/618,697

(22) Filed: Dec. 29, 2006

(65) Prior Publication Data

US 2008/0123402 A1 May 29, 2008

(30) Foreign Application Priority Data

Sep. 29, 2006 (KR) ...................... 10-2006-0096246

(51) Int. Cl.
*G11C 11/34* (2006.01)
*G11C 11/04* (2006.01)
(52) U.S. Cl. ............................ 365/185.02; 365/185.17; 365/185.18; 365/185.29
(58) Field of Classification Search ............ 365/185.17, 365/185.02, 185.28, 185.18
See application file for complete search history.

(56) References Cited

U.S. PATENT DOCUMENTS

| | | | | |
|---|---|---|---|---|
| 5,715,194 | A * | 2/1998 | Hu ........................ | 365/185.17 |
| 6,859,397 | B2 | 2/2005 | Lutze et al. | |
| 6,987,694 | B2 | 1/2006 | Lee | |
| 7,161,833 | B2 * | 1/2007 | Hemink ................ | 365/185.18 |
| 7,170,793 | B2 * | 1/2007 | Guterman .............. | 365/185.28 |
| 7,180,787 | B2 * | 2/2007 | Hosono et al. ......... | 365/185.24 |
| 7,184,309 | B2 * | 2/2007 | Matsunaga et al. ..... | 365/185.17 |
| 7,212,435 | B2 * | 5/2007 | Rudeck et al. ......... | 365/185.02 |
| 7,272,039 | B2 * | 9/2007 | Rudeck et al. ......... | 365/185.02 |
| 7,355,889 | B2 * | 4/2008 | Hemink et al. ......... | 365/185.17 |
| 7,433,233 | B2 * | 10/2008 | Chen et al. ............. | 365/185.17 |
| 7,440,326 | B2 * | 10/2008 | Ito ........................ | 365/185.18 |
| 2004/0080980 | A1 * | 4/2004 | Lee ....................... | 365/185.17 |
| 2005/0018462 | A1 * | 1/2005 | Hosono et al. ................ | 365/36 |
| 2005/0047210 | A1 | 3/2005 | Matsunaga et al. | |
| 2005/0174852 | A1 | 8/2005 | Hemink | |
| 2005/0226055 | A1 | 10/2005 | Guterman | |
| 2006/0245251 | A1 * | 11/2006 | Shirota et al. .......... | 365/185.17 |
| 2007/0291542 | A1 * | 12/2007 | Aritome ................ | 365/185.18 |
| 2008/0049494 | A1 * | 2/2008 | Aritome ................ | 365/185.02 |

FOREIGN PATENT DOCUMENTS

| | | |
|---|---|---|
| JP | 2000-048581 A | 2/2000 |
| JP | 2002-260390 A | 9/2002 |
| JP | 2006-309902 | 11/2006 |
| KR | 10-0145475 B1 | 4/1998 |
| KR | 10-0297602 B1 | 5/2001 |
| TW | I220252 | 8/2004 |
| TW | I262506 | 9/2006 |

* cited by examiner

*Primary Examiner*—Ly D Pham
(74) *Attorney, Agent, or Firm*—Townsend and Townsend and Crew LLP

(57) ABSTRACT

A method for programming a flash memory device includes applying a program bias to a memory cell of a plurality of memory cells within a memory cell string. Each memory cell string comprises a source select line, a plurality of memory cells and a drain select line. A first pass bias is applied to at least one of the memory cells in a source select line direction relative to the memory cell to which the program bias has been applied. A second pass bias is applied to the memory cells in a drain select line direction relative the memory cell(s) to which the first pass bias has been applied.

7 Claims, 2 Drawing Sheets

METHOD FOR PROGRAMMING A FLASH MEMORY DEVICE

CROSS-REFERENCE TO RELATED APPLICATIONS

This application claims priority to Korean Patent Application No. 2006-96246, filed on Sep. 29, 2006, the contents of which are incorporated herein by reference in its entirety.

BACKGROUND OF THE INVENTION

The present invention relates to flash memory devices and, more particularly, to a method for programming a flash memory device, which prevents interference between memory cells when the memory cells are programmed.

A memory cell array of a NAND flash memory device includes a plurality of memory cell strings connected to bit lines. Each of the memory cell strings includes a drain select transistor, a plurality of memory cells and a source select transistor. A gate terminal of each of the memory cells is connected to a word line, and operates in response to a signal received from the bit line and the word line.

FIG. 1 illustrates a conventional method for programming a flash memory device. The flash memory device includes memory cell string having seven memory cells. The method for programming the flash memory device is performed such that electrons move to a floating gate in a channel of a memory cell. The memory cell may be selected by Fowler Nordheim (FN) tunneling.

A voltage applied to word lines WL0 to WL6 while programming the memory cell string is at least 15 V. A selected memory cell string in which the selected memory cell is included is maintained at 0 V. The 0 V at the selected memory cell string increases the potential difference between the word lines and the channel by a maximum amount, thereby facilitating FN tunneling.

When a memory cell string has not been programmed, (i.e., an unselected memory cell string) electrons are not moved by FN tunneling. Thus, the potential difference between the word lines and the channel is minimized. When memory cell string is programmed, a negative potential exists at the floating gate even though a high word line voltage is applied. Accordingly, the potential at the channel is significantly decreased and lowers a channel boosting potential level.

A conventional method of maintaining the channel at a high boosting potential level applies a high gate voltage to all unselected word lines. However, the load of a flash memory device maintains a high word line voltage, and a pass disturb phenomenon (i.e., an incomplete program phenomenon) occurs at unselected memory cell strings resulting in unreliable memory devices.

BRIEF SUMMARY OF THE INVENTION

The present invention provides a method for programming a flash memory device. A memory cell to be programmed is maintained at a low boosting potential level by excluding the memory cell from a channel boosting region. The memory cell is excluded from the channel boosting region by deactivation of the memory cell due to the sequential programming of memory cells from a source part to a drain part in a memory cell string.

In one embodiment, a method of programming a flash memory device includes applying a program bias to a selected memory cell of a plurality of memory cells within a memory cell string. The memory cell string includes a source select line, a plurality of memory cells and a drain select line. A first pass bias is applied to at least one of the memory cells in a source select line direction relative to the selected memory cell to which the program bias has been applied. A second pass bias is applied to the memory cells in a drain select line direction relative to the cell(s) to which the first pass bias has been applied.

DESCRIPTION OF SPECIFIC EMBODIMENTS

A specific embodiment according to the present patent will be described with reference to the accompanying drawings.

Figure 1:
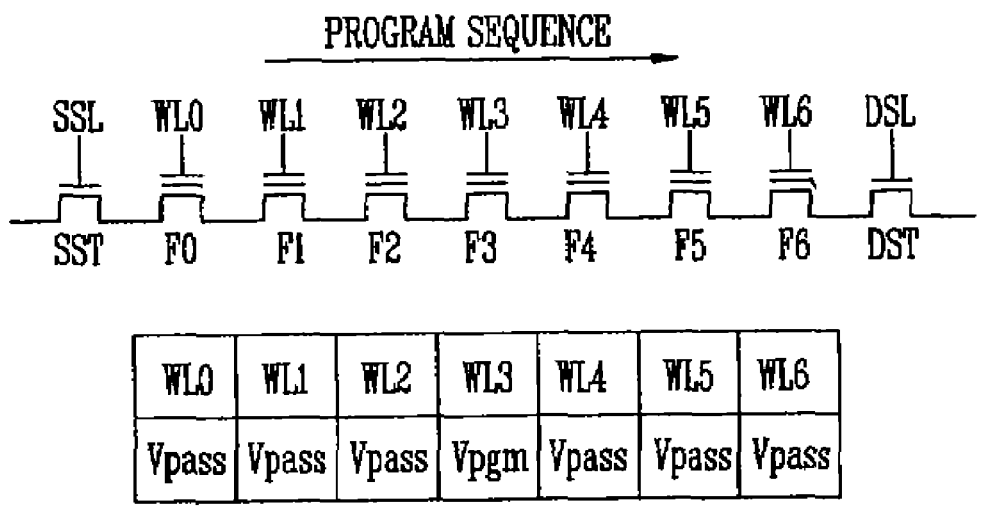
FIG. 1 illustrates a conventional method for programming a flash memory device.
Figure 2:
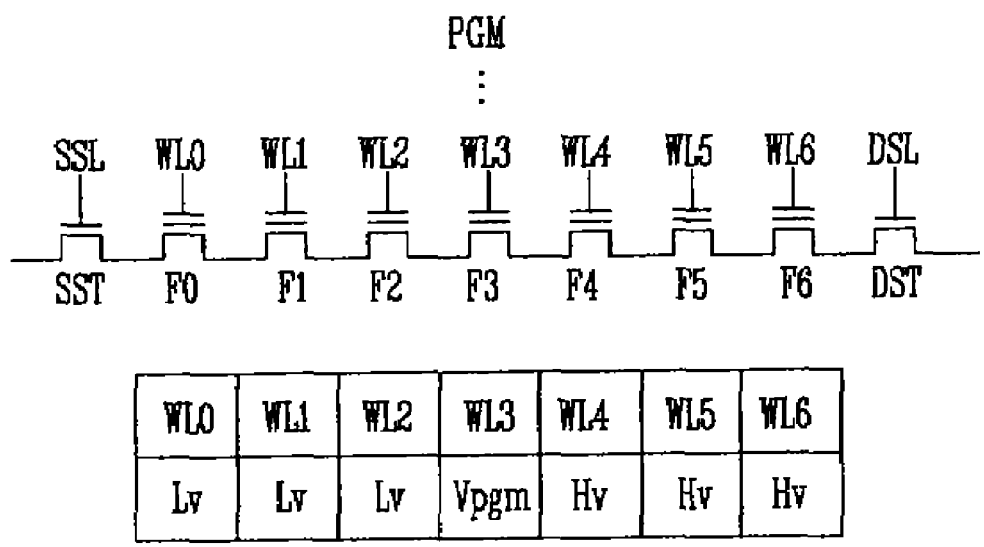
FIGS. 2 to 4 illustrate a method for programming a flash memory device according to an embodiment of the present invention.
Figure 3:
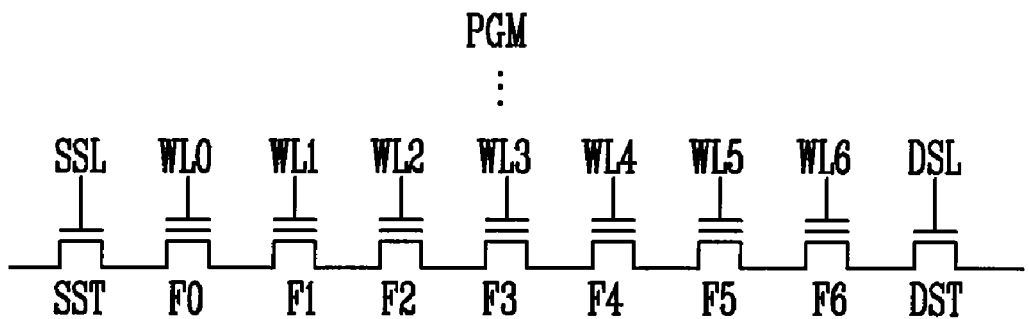
Figure 4:
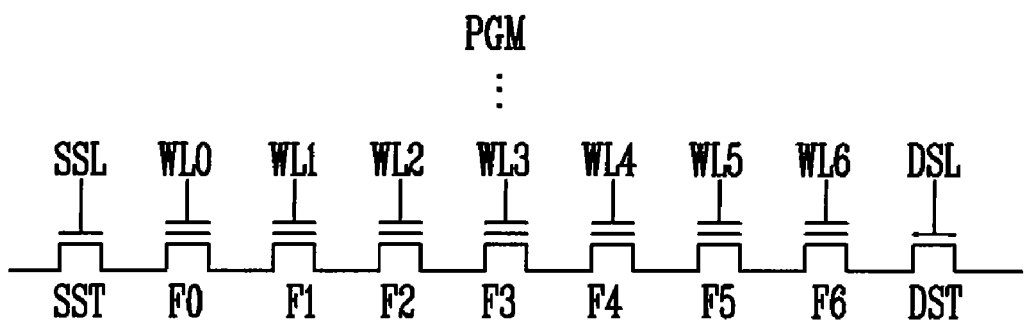

FIGS. 2 to 4 illustrate a method for programming a flash memory device according to an embodiment of the present invention.

Referring to FIG. 2, a memory cell array of a flash memory device includes a plurality of memory cell strings for storing data. The memory cell strings each have a similar structure. One memory cell string is described below.

A memory cell string includes a drain select transistor DST, memory cells F0 to F6, and a source select transistor SST. The drain select transistor DST is connected between a bit line and a sixth memory cell F6. The memory cells F0 to F6 are connected in series between the drain select transistor DST and the source select transistor SST. The source select transistor SST is connected between the memory cell F0 and a common source line.

In order to prevent a decrease in potential at a memory cell, a sequential programming method is adapted to program a memory cell on a per page basis. A program bias (Vpgm) is applied beginning at a $0^{th}$ word line WL0, a first word line WL1, and so on, until the program bias is applied to a sixth word line WL6. In other words, the programming is performed sequentially from a source side (or the side of the source select transistor) to a drain side (or the side of the drain select transistor) of the memory cell string.

In one embodiment, for the memory cell F3 is selected for programming, the memory cells (i.e., memory cells F0 to F2) on the source side relative to the selected memory cell F3 are maintained at an increased threshold voltage during programming. The memory cells F4 to F6 on the drain side relative to the selected cell F3 are not maintained at an increased threshold voltage.

In one embodiment, a high voltage is also applied to memory cells (not shown) which share the selected memory cell F3 and the word line of unselected memory cell strings. A shallow programming may occur between a memory cell to which voltage is applied and a memory cell to which voltage is not applied. In order to prevent shallow programming, different voltages are applied to the memory cells on the source side and the drain side relative to the selected cell F3, as described below in detail.

A low voltage (Lv) is applied to the word lines WL0 to WL2 of the memory cells F0 to F2 located on the source side of the selected memory cell F3. A high voltage (Hv) is applied to the word lines WL4 to WL6 on the drain side of the selected memory cell F3. The low voltage lies within a range of approximately 0 to approximately 1.5 V, and the high voltage lies within a range of approximately 7 to approximately 13 V.

The memory cells on the source side are not all activated, and therefore do not impact channel potential. However, since the threshold voltage is lowered, channels are formed in the memory cells F4 to F6 on the drain side of the selected memory cell F3 (i.e., the memory cells F4 to F6 are in an erase state).

If the drain select transistor DST is deactivated, a pass bias is applied to the floating gate of the memory cells F4 to F6 on the drain side of the selected cell F3, thereby forming a higher self-boosting potential level. A high self-boosting potential level prevents program defects.

Referring to FIG. 3, the word lines WL1 to WL2 of the memory cells F1 to F2 located on the source side of the selected cell F3 are maintained at a low voltage (Lv). The word lines WL4 to WL6 on the drain side of the selected cell F3 are maintained at a high voltage (Hv). The low voltage lies within a range of approximately 0 to approximately 1.5 V and the high voltage lies within a range of approximately 7 to approximately 13 V.

The word line WL0 in the direction of the source select line is not maintained at the low voltage. Rather, a high voltage (Hv) of approximately 5 to approximately 13 V is applied to the word line WL0. Since the memory cells on the source side of the selected memory cell F3 are not activated, the channel potential is not impacted. However, since the threshold voltage is lowered, channels are formed in the memory cells F4 to F6 existing on the drain side of the selected memory cell F3 (i.e., the memory cells F4 to F6 are in an erase state).

If the drain select transistor is deactivated, a pass bias is applied to the floating gate of the memory cells F4 to F6 existing on the drain side of the selected memory cell F3, thereby forming a higher self-boosting potential level. A high self-boosting potential level prevents program defects.

Referring to FIG. 4, the word line WL2 of the memory cell F2 is maintained at a low voltage (Lv). The word line WL2 is located on the source side of the selected memory cell F3 and is proximate the selected memory cell F3. The word lines WL4 to WL6 on the drain side of the selected memory cell F3 are maintained at a high voltage (Hv). The low voltage lies within a range of approximately 0 to approximately 1.5 V, and the high voltage lies within a range of approximately 7 to approximately 13 V.

The word line WL1 in a source select line direction from the selected memory cell F3 is not maintained at the low voltage. Rather, a high voltage (Hv) of approximately 5 to approximately 13 V is applied to the word line WL1. Since all the memory cells on the source side of the selected memory cell F3 are not activated, the channel potential is not impacted. However, since the threshold voltage is lowered, channels are formed in the memory cells F4 to F6 on the drain side of the selected memory cell F3 (i.e., the memory cells F4 to F6 are in an erase state).

If the drain select transistor is deactivated, a pass bias is applied to the floating gate of the memory cells F4 to F6 on the drain side of the selected memory cell F3, thereby forming a higher self-boosting potential level. A high self-boosting potential level prevents program defects.

As described above, a low voltage is applied to any one of the memory cells located in a source direction relative to a memory cell selected for programming, and a high voltage is applied to a word line of the memory cells located in a drain direction relative to the selected memory cell. Since the memory cells in the source direction of the selected memory cell are deactivated, interference impacting the channel potential may be decreased. The memory cells on the drain side of the selected memory cell (i.e., the memory cells in an erase state) have a high threshold voltage and are all activated, thereby forming a channel.

If the drain select transistor DST is deactivated, a pass bias is applied to a positive potential of the floating gate constituting the memory cells, thereby forming a high self-boosting potential level. The channel potential of memory cell strings selected to perform the programming is set to an approximately 0 V potential due to the influence of bit lines. Thus, the channel potential of the memory cell strings is unaffected by the floating gate level between surrounding cells. Accordingly, since a high self-boosting potential level is achieved, program interference is reduced.

The above embodiments of the present invention are illustrative and not limitative. Various alternatives and equivalents are possible. Other additions, subtractions, or modifications are obvious in view of the present disclosure and are intended to fall within the scope of the appended claims.

What is claimed is:

1. A program method for programming of a flash memory device, the method comprising:
    applying a program bias to a selected memory cell of a plurality of memory cells within a memory cell string, the memory cell string comprising a source select line, a plurality of memory cells and a drain select line, wherein the plurality of memory cells are arranged in series between the source select line at one end and the drain select line at an opposite end;
    applying a first pass bias to two memory cells next to the selected memory cell in a source select line direction relative to the selected memory cell, wherein the first pass bias is lower than the program bias;
    applying a second pass bias to all memory cells in a drain select line direction relative to the selected memory cell, wherein the first pass bias is lower than the second pass bias; and
    applying a third pas bias to remaining memory cells in the source select line direction relative to the selected memory cell to which the program bias is applied excluding the two memory cells to which the first pass bias is applied, the third pass bias creating channels in the memory cells in the drain select line direction relative to the selected memory cell to which the program bias is applied, wherein the third pass bias is lower than the second pass bias.

2. The method of claim 1, wherein the first pass bias lies within a range from approximately 0 to approximately 1.5 V.

3. The method of claim 1, wherein the second pass bias lies within a range from approximately 7 to approximately 13 V.

4. The method of claim 2, wherein the third pass bias lies within a range from approximately 5 to approximately 13 V.

5. A program method for programming a flash memory device, the method comprising:
    applying a program bias to a selected memory cell of a plurality of memory cells within a memory cell string, the memory cell string comprising a source select line, a plurality of memory cells and a drain select line, wherein the plurality of memory cells are arranged in series between the source select line at one end and the drain select line at an opposite end;
    applying a first pass bias to three memory cells next to the selected memory cell in a source select line direction relative to the selected memory cell, wherein the first pass bias is lower than the program bias;

applying a second pass bias to all memory cells in a drain select line direction relative to the selected memory cell, wherein the first pass bias is lower than the second pass bias; and applying a third pass bias to the remaining memory cells in the source select line direction relative to the selected memory cell to which the program bias is applied excluding the three memory cells to which the first pass bias is applied, the third pass bias creating channels in the memory cells in the drain select line direction relative to the selected memory cell to which the program bias is applied, wherein the third pass bias is lower than the second pass bias.

6. The method of claim 5, wherein the third pass bias is lower than the second pass bias.

7. The method of claim 5, wherein the third pass bias lies within a range from approximately 5 to approximately 13 V.

* * * * *